(12) United States Patent
Yi et al.

(10) Patent No.: US 9,337,146 B1
(45) Date of Patent: May 10, 2016

(54) THREE-DIMENSIONAL INTEGRATED CIRCUIT STACK

(71) Applicant: QUALCOMM Incorporated, San Diego, CA (US)

(72) Inventors: Wei Yi, San Diego, CA (US); Yi Lou, San Diego, CA (US); Paul Penzes, San Diego, CA (US); Pranjal Srivastava, San Diego, CA (US)

(73) Assignee: Qualcomm Incorporated, San Diego, CA (US)

( * ) Notice: Subject to any disclaimer, the term of this patent is extended or adjusted under 35 U.S.C. 154(b) by 0 days.

(21) Appl. No.: 14/611,035

(22) Filed: Jan. 30, 2015

(51) Int. Cl.
*H01L 23/48* (2006.01)
*H01L 23/528* (2006.01)
*H01L 27/06* (2006.01)
*H01L 23/00* (2006.01)

(52) U.S. Cl.
CPC .......... *H01L 23/5283* (2013.01); *H01L 23/481* (2013.01); *H01L 24/82* (2013.01); *H01L 27/0688* (2013.01)

(58) Field of Classification Search
CPC . H01L 23/5283; H01L 23/481; H01L 23/535; H01L 25/043; H01L 2224/29027; H01L 24/82; H01L 27/0688
USPC ........................................................ 257/774
See application file for complete search history.

(56) References Cited

U.S. PATENT DOCUMENTS

| | | | |
|---|---|---|---|
| 6,563,205 B1 | 5/2003 | Fogal et al. | |
| 6,884,657 B1 | 4/2005 | Fogal et al. | |
| 7,042,079 B2 | 5/2006 | Gabara et al. | |
| 7,089,519 B1* | 8/2006 | Teig | G06F 17/5072 716/123 |
| 7,098,541 B2 | 8/2006 | Adelmann | |
| 7,143,383 B1 | 11/2006 | Teig et al. | |
| 8,166,442 B2* | 4/2012 | Hetzel | G06F 17/5077 716/126 |
| 8,836,137 B2 | 9/2014 | Chen | |
| 2013/0256908 A1 | 10/2013 | McLaurin | |

OTHER PUBLICATIONS

Ahmad, Seraj et al., "X-Routing using Two Manhattan Route Instances," IEEE Proceedings of the 2005 International Conference on Computer Design, 2005, 6 Pages.
Chen, Hongyu et al., "The Y Architecture for On-Chip Interconnect: Analysis and Methodology," IEEE Transactions on Computer-Aided Design of Integrated Circuits and Systems, 2005, vol. 24 (4), pp. 588-599.
Thumaty, Kalyan et al., "Designing ICs with the 'X' Architecture," United Business Media EE Times, [Retrieved on Nov. 14, 2014], Retrieved from the Internet: URL: http://www.design-reuse.com/articles/11225/designing-ics-with-the-x-architecture.html, 7 Pages.

(Continued)

*Primary Examiner* — Tu-Tu Ho
(74) *Attorney, Agent, or Firm* — Toler Law Group, PC

(57) ABSTRACT

A particular three-dimensional integrated circuit stack includes a first die including a first bonding interface and a first plurality of interconnect layers arranged according to a first Manhattan wiring scheme. The three-dimensional integrated circuit stack also includes a second die including a second bonding interface and a second plurality of interconnect layers arranged according to a second Manhattan wiring scheme. The first die and the second die stacked with the first bonding interface coupled to the second bonding interface such that the first Manhattan wiring scheme and the second Manhattan wiring scheme are non-Manhattan with respect to each other.

29 Claims, 7 Drawing Sheets

(56) References Cited

OTHER PUBLICATIONS

Igarashi, Mutsunori et al., "A Diagonal Interconnect Architecture and its Application to RISC Core Design," IEEE / ISSCC 2002 Visuals Supplement, 2002, pp. 166-167.

Kumar, Santosh et al., "Candidate Generation for 45 Degree Routing for Mixed-Signal Layout," Southwest Symposium on Mixed-Signal Design, 2003, pp. 233-236.

Stan, Mircea R. et al., "Non-Manhattan Maze Routing," 17th Symposium on Integrated Circuits and Systems Design, IEEE, 2004, pp. 260-265.

Teig, Steven L., "The X Architecture: Not Your Father's Diagonal Wiring," Proceedings of the 2002 International Workshop on System-Level Interconnect Prediction, 2002, pp. 33-37.

Yu, Yongbin et al., "Crosstalk Minimization in Four-Layer Non-Manhattan Channel Routing," International Conference on Communications, Circuits and Systems, 2004, pp. 1281-1285.

X Initiative Home, 2006, retrieved from <<https://web.archive.org/web/20060810230615/http:www.xinitiative.org/, 1 page.

Wilson, R., "X-based routing broadens reach with fab move", Dec. 15, 2003, EE Times, San Francisco, CA, 3 pages.

\* cited by examiner

THREE-DIMENSIONAL INTEGRATED CIRCUIT STACK

I. FIELD

The present disclosure is generally related to three-dimensional integrated circuit stacks.

II. DESCRIPTION OF RELATED ART

Advances in technology have resulted in smaller and more powerful computing devices. For example, there currently exist a variety of portable personal computing devices, including wireless telephones such as mobile and smart phones, tablets and laptop computers that are small, lightweight, and easily carried by users. These devices can communicate voice and data packets over wireless networks. Further, many such devices incorporate additional functionality such as a digital still camera, a digital video camera, a digital recorder, and an audio file player. Also, such devices can process executable instructions, including software applications, such as a web browser application, that can be used to access the Internet. As such, these devices can include significant computing capabilities.

Additionally, advances in technology have enabled manufacture of smaller integrated circuits and electronic devices. In addition to decreased size, many of these integrated circuits have been optimized to provide lower power and higher speed operation. As integrated circuit and electronic device sizes have decreased and low power/high speed operation have become more important, some circuit characteristics have become more limiting. For example, decreases in line widths used in integrated circuits have decreased cross sectional areas of wires used to route signals. Decreased cross sectional area leads to increased resistance of the wires. However, since the number of electronic devices in each integrated circuit has continued to increase, there has not been a corresponding decrease in wire length to offset the decrease in cross sectional area. Accordingly, wire resistance has become an increasingly important limitation on performance of many integrated circuits.

III. SUMMARY

To overcome the influence of wire resistance on integrated circuit performance, overall length of wires used to route signals (e.g., current or voltage) between the electronic devices of the integrated circuit may be shortened. Shortening wire traces between the electronic devices can be done by spacing electronic device closer together in the integrated circuit; however, manufacturing and design constraints can limit benefits that can be achieved by adjusting spacing.

Wire lengths may also be reduced by using modifying wire routing. However, traditional wiring schemes can limit benefits that can be gained by modified wire routing. For example, due to manufacturing constraints, very large scale integrated circuits often use Manhattan wiring schemes (also referred to as "taxicab routing") to interconnect circuit devices. Manhattan wiring schemes refer to wiring schemes in which wires are arranged in a manner that mimics city blocks. For example, each section of wire is oriented in one of two orthogonal directions, e.g., in a direction parallel to an X-axis (referred to by convention as "horizontal") or in a direction parallel to a Y-axis (referred to by convention as "vertical") of a Cartesian coordinate system. Often wires in a Manhattan wiring scheme are arranged in a plurality of metal layers interconnected by conductive vias. In this arrangement, each layer includes wires oriented in a single direction (e.g., horizontal or vertical), and alternate layers include wires oriented in different directions (e.g., if a first layer includes horizontal wires, the next layer includes vertical wires). Thus, in a Manhattan wiring scheme, the wire length to interconnect two electronic devices may have a lower limit of the horizontal distance between the devices (i.e., an X-direction component of the distance) plus the vertical distance between the devices (i.e., a Y-direction component of the distance).

To overcome the wire length limitations of Manhattan wiring schemes, diagonal wire traces may be added. However, for very small wire widths, adding metal layers with diagonal (relative to a Manhattan wiring scheme) wires can give rise to considerable manufacturing difficulties, such as alignment and multiple patterning and/or multiple exposure complications.

Devices, according to particular examples described herein, decrease wire lengths while also using Manhattan wiring schemes. For example, two or more integrated circuit dies may be assembled to form a three-dimensional (3D) integrated circuit (IC) stack. Each die of the 3D IC stack may include wiring arranged according to a Manhattan wiring scheme. When the dies are stacked, the Manhattan wiring schemes are angularly offset from one another. For example, a first die may include first wiring arranged according to a first Manhattan routing scheme, and a second die may include second wiring arranged according to a second Manhattan routing scheme. When a bonding interface of the first die is electrically connected to a bonding interface of the second die to form the 3D IC stack, the first Manhattan routing scheme may be non-Manhattan (e.g., may include wires that are not horizontal and are not vertical) relative to the second Manhattan routing scheme. For example, the first wiring may include first horizontal wires oriented substantially parallel to a 0° reference axis and first vertical wires oriented substantially parallel to a 90° reference axis. In this example, the second wiring may include second horizontal wires oriented substantially parallel to a 45° reference axis and second vertical wires oriented substantially parallel to a −45° reference axis. Alternately, in this example, the second wiring may be offset from the first wiring to form another angular difference. To illustrate, the second wiring may be offset (e.g., have an angular difference) from the first wiring of between 5° and 85°.

Electronic devices of the 3D IC stack may be connected via wiring on either or both of the dies. For example, an electronic device on the first die may be coupled to an electronic device on the second die using wiring of both the first die and the second die. Accordingly, wiring that is diagonal relative to one of the Manhattan wiring schemes can be used to interconnect the electronic devices in order to shorten an overall connection length between the two electronic devices. Similarly, a first electronic device on the first die may be coupled to a second electronic device on the first die using wiring on the second die. Accordingly, diagonal wiring relative to the Manhattan wiring scheme of the first die may be used to connect the two electronic devices of the first die in order to shorten overall interconnection length between the two electronic devices. Since each die includes a Manhattan wiring scheme, difficulties associated with fabricating non-Manhattan wiring (e.g., diagonal wires) are avoided. However, the 3D IC stack makes diagonal wires available to shorten overall wire lengths.

In a particular aspect, a 3D IC stack is disclosed. The 3D IC stack includes a first die. The first die includes a first set of wiring having a first layout orientation and includes a first bonding interface coupled to the first set of wiring. The 3D IC stack also includes a second die. The second die includes a second set of wiring having a second layout orientation and includes a second bonding interface coupled to the second set of wiring. The first die and the second die are stacked with the first bonding interface coupled to the second bonding interface such that an angular difference between the first layout orientation and the second layout orientation is greater than or equal to 5 degrees and less than or equal to 85 degrees.

In another particular aspect, a 3D IC stack includes a first die that includes a first bonding interface and a first plurality of interconnect layers arranged according to a first Manhattan wiring scheme. The 3D IC stack also includes a second die that includes a second bonding interface and a second plurality of interconnect layers arranged according to a second Manhattan wiring scheme. The first die and the second die are stacked with the first bonding interface coupled to the second bonding interface such that the first Manhattan wiring scheme and the second Manhattan wiring scheme are non-Manhattan with respect to each other.

In another particular aspect, a 3D IC stack includes a first die that includes a first electronic device, a second electronic device, and a first set of wires arranged according to a first Manhattan wiring scheme and coupled to a first bonding interface. The 3D IC stack also includes a second die that includes a second set of wires coupled to a second bonding interface. The first die and the second die are stacked such that the first bonding interface is coupled to the second bonding interface to form a conductive path between the first electronic device and the second electronic device using a wire of the second set of wires, where the conductive path is shorter than a conventional path between the first electronic device and the second electronic device based on the first Manhattan wiring scheme.

In another particular aspect, a method of manufacturing a 3D IC stack includes aligning a first bonding interface of a first die and a second bonding interface of a second die. The first die includes a first set of wiring having a first layout orientation coupled to the first bonding interface, and the second die includes a second set of wiring having a second layout orientation coupled to the second bonding interface. When the first bonding interface and the second bonding interface are aligned, an angular difference between the first layout orientation and the second layout orientation is greater than or equal to 5 degrees and is less than or equal to 85 degrees. The method also includes electrically connecting the first bonding interface and the second bonding interface.

In another particular aspect, a method of routing a signal (e.g., a current or voltage) includes routing a signal in a first die using a first wire of a first set of wires, the first set of wires arranged according to a first layout orientation. The method also includes routing the signal from a first bonding interface of the first die to a second bonding interface of a second die. The method further includes routing the signal in the second die using a second wire of a second set of wires, the second set of wires arranged according to a second layout orientation. The first die and the second die are stacked such that an angular difference between the first layout orientation and the second layout orientation is greater than or equal to 5 degrees and less than or equal to 85 degrees.

In another particular aspect, a method of routing a signal includes routing a signal in a first die using a first set of wires arranged in a first plurality of interconnect layers according to a first Manhattan wiring scheme. The method also includes routing the signal from a first bonding interface of the first die to a second bonding interface of a second die. The method further includes routing the signal in the second die using a second set of wires arranged in a second plurality of interconnect layers according to a second Manhattan wiring scheme. The first die and second die are stacked such that the first Manhattan wiring scheme and the second Manhattan wiring scheme are non-Manhattan with respect to each other.

In another particular aspect, a method of routing a signal includes routing a signal from a first electronic device of a first die to a first bonding pad of the first die using a first wire of a first set of wires. The method also includes routing the signal from a first bonding pad to a second bonding pad of a second die. The method further includes routing the signal in the second die from the second bonding pad to a third bonding pad of the second die using a second wire of a second set of wires. The second set of wires is arranged according to a Manhattan wiring scheme. The method also includes routing the signal from a third bonding pad to a fourth bonding pad of a first die. The method further includes routing the signal from the fourth bonding pad to a second electronic device of the first die using a third wire of the first set of wires.

One particular advantage provided by at least one of the disclosed embodiments is that fabrication processes used to form Manhattan wiring schemes may be used to provide diagonal (e.g., non-Manhattan) interconnections between electronic devices. The diagonal interconnections can be used to reduce wire lengths between the electronic devices, thereby reducing wire resistance associated with the interconnections. Other aspects, advantages, and features of the present disclosure will become apparent after review of the entire application, including the following sections: Brief Description of the Drawings, Detailed Description, and the Claims.

IV. BRIEF DESCRIPTION OF THE DRAWINGS

V. DETAILED DESCRIPTION

Figures 1, 2, 3:
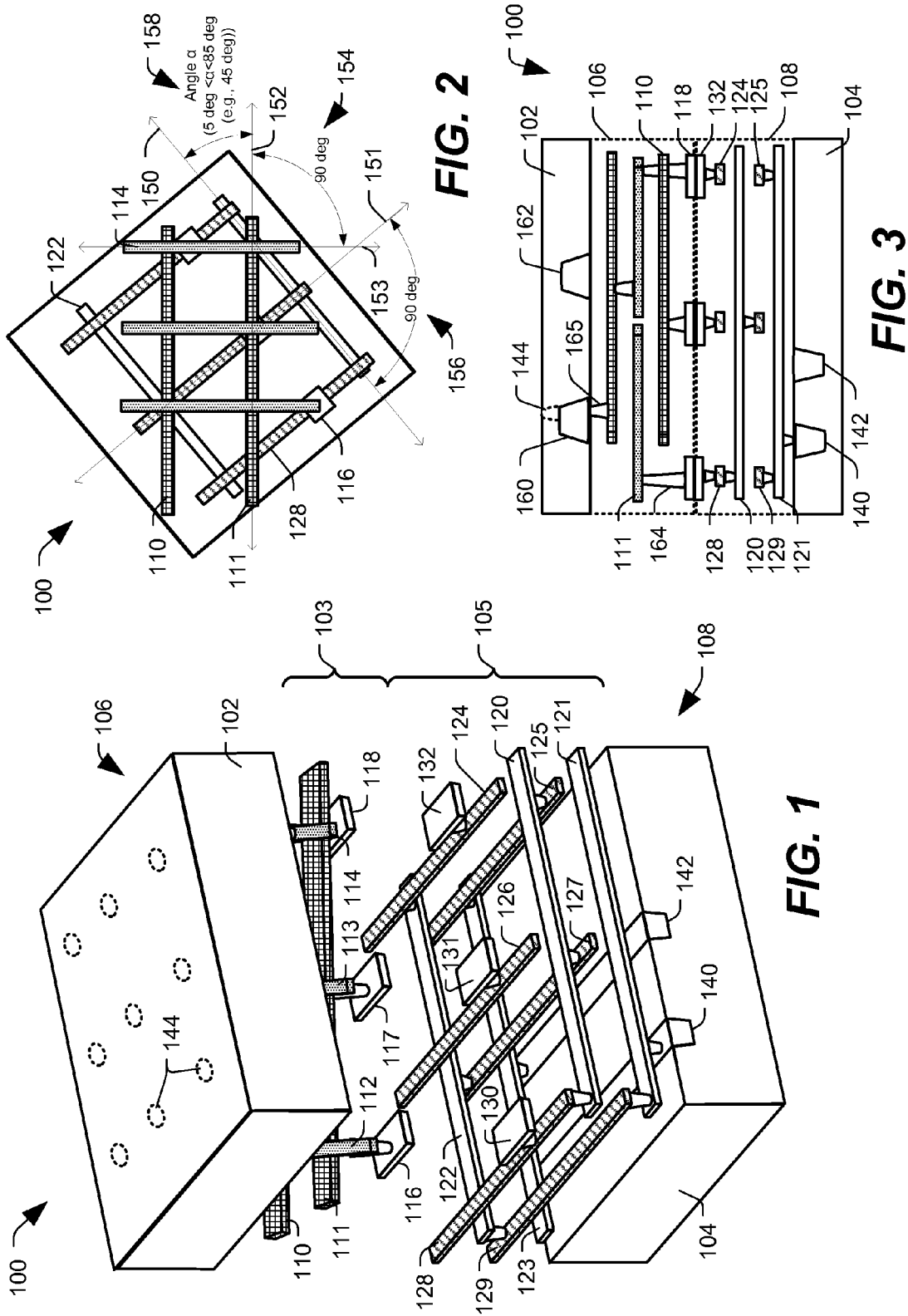
FIG. 1 is a diagram illustrating a perspective view of a particular illustrative embodiment of a three-dimensional integrated circuit stack.
FIG. 2 is a diagram of a top view of a particular illustrative embodiment of the three-dimensional integrated circuit stack of FIG. 1.
FIG. 3 is a diagram of a cross-sectional view of a particular illustrative embodiment of the three-dimensional integrated circuit stack of FIG. 1.

FIGS. 1, 2, and 3 illustrate a particular embodiment of a three-dimensional (3D) integrated circuit (IC) stack 100 that includes a first die 106 and a second die 108. FIG. 1 illustrates a perspective view of the first die 106 separate from the second die 108. FIG. 2 illustrates a top view of wiring of the first die 106 and wiring of the second die 108. FIG. 3 illustrates a cross sectional view of the first die 106 and the second die 108 in contact to form the 3D IC stack 100.

In FIGS. 1-3, certain components have been omitted to highlight the arrangement of the wires of the dies 106, 108. For example, dielectric separating the wires of the dies 106, 108 has been omitted. Additionally, only a few representative electronic devices and a few representative vias have been illustrated. The specific arrangement and number of wiring layers, vias, and electronic devices in particular embodiments will depend on specific circuit and design goals. For example, in a particular embodiment, the first die 106 includes one or more processing elements and the second die 108 includes one or more memory elements. To illustrate, the first die 106 may include or correspond to a processing die including a digital signal processor (DSP), a graphics processor unit (GPU), a central processing unit (CPU), or one or more processing cores thereof. In this example, the second die 108 may include a memory die including memory (e.g., a cache) that is accessible to the one or more processors of the first die 106. Accordingly, the 3D IC stack shown in FIGS. 1-3 is non-limiting and should be considered illustrative of the principles and embodiments disclosed herein.

In FIGS. 1-3, the first die 106 includes a first substrate 102 and first wiring 103, and the second die 108 includes a second substrate 104 and second wiring 105. The first wiring 103 includes a set of wires 110, 111 that are oriented in a first direction 152, and a set of wires 112, 113, 114 that are oriented in a second direction 153. The first direction 152 is perpendicular to the second direction 153, as illustrated by angle 154 of FIG. 2. Accordingly, the first wiring 103 includes a plurality of wires arranged in a first Manhattan wiring scheme. The first wiring 103 is coupled to a first bonding interface including bonding pads 116, 117, and 118.

The second wiring 105 includes a set of wires 120, 121, 122, and 123 that are oriented in a third direction 150 and a set of wiring 124, 125, 126, 127, 128, and 129 that are oriented in a fourth direction 151. The third direction 150 is substantially perpendicular to the fourth direction 151, as illustrated by angle 156 of FIG. 2. Accordingly, the second wiring 105 is arranged according to a second Manhattan wiring scheme. The second Manhattan wiring scheme may be different than the first Manhattan wiring scheme. For example, the first direction 152 may be separated from the third direction 150 by an angle 158 that is acute, such as between 5° and 85°. To illustrate, the angle 158 may be about 45° (e.g., between 40° and 50°). Thus, while the first wiring 103 is arranged according to a first Manhattan wiring scheme and the second wiring 105 is arranged according to a second Manhattan wiring scheme, the first Manhattan wiring scheme is non-Manhattan with respect to the second Manhattan wiring scheme.

The second wiring 105 may be coupled to a second bonding interface, such as bonding pads 130, 131, 132. The second bonding interface may be arranged to correspond to the first bonding interface. For example, when the first die 106 is coupled to the second die 108, the bonding pads 116-118 may substantially align (e.g., align sufficiently to enable electrical interconnection) with corresponding bonding pads 130-132 and may be electrically connected (e.g., by a solder ball or other electrically conductive connection). When the bonding pads 116-118 are substantially aligned with the corresponding bonding pads 130-132, sides of the dies 106, 108 may also be substantially aligned (e.g., align sufficiently to packaging of the 3D IC stack 100).

Each of the dies 106, 108 may include one or more electronic devices. For example, the first die 106 may include electronic devices 160, 162, and the second die 108 may include electronic devices 140, 142. Additionally, one or both of the dies 106, 108 may include an external interface on a surface that is opposite the bonding interface. For example, the external interface may include one or more through silicon vias 144 that enable the first die 106 to be coupled to an additional die (such as in FIG. 5). The various wiring layers of the first wiring 103 and the second wiring 105 may be coupled to one another and to corresponding bonding pads by vias, such as vias 164 and 165.

The electronic devices 140, 142, 160 and 162 of the 3D IC stack 100 may be interconnected using portions of the first wiring 103, portions of the second wiring 105, or portions of both the first wiring 103 and the second wiring 105. In this arrangement, wiring that is arranged according to a Manhattan wiring scheme can be used to provide diagonal interconnections to reduce wire length for certain device interconnection signal paths, as described further with reference to FIG. 4.

For example, a first electronic device 140 of the second die 108 may be coupled to the second electronic device 142 of the second die 108 using one or more wires of the second wiring 105 as well as one or more wires of the first wires 103. Since the first wires 103 are diagonal relative to the Manhattan wiring scheme of the second die 108, an overall connection distance between the first electronic device 140 and the second electronic device 142 may be shortened relative to connecting the first electronic device 140 and second electronic device 142 using only the Manhattan wiring scheme of the second wiring 105. Similarly, a third electronic device 160 and a fourth electronic device 162 of the first die 106 may be interconnected using one or more wires of the first wiring 103, one or more wires of the second wiring 105, or both. Additionally, an electronic device of the first die 106 (such as the third electronic device 160) may be coupled to an electronic device of the second die 108 (such as the first electronic device 140) using wires of the first wiring 103 and wires of the second wiring 105. Thus, the 3D IC stack including two different Manhattan wiring schemes enables use of diagonal routing arrangements that are not available in traditional Manhattan wiring schemes. Additionally, since both of the dies 106, 108 can be manufactured using Manhattan wiring scheme fabrication processes, difficulty associated with forming diagonal wires or non-Manhattan wiring schemes can be avoided.

Figure 4:
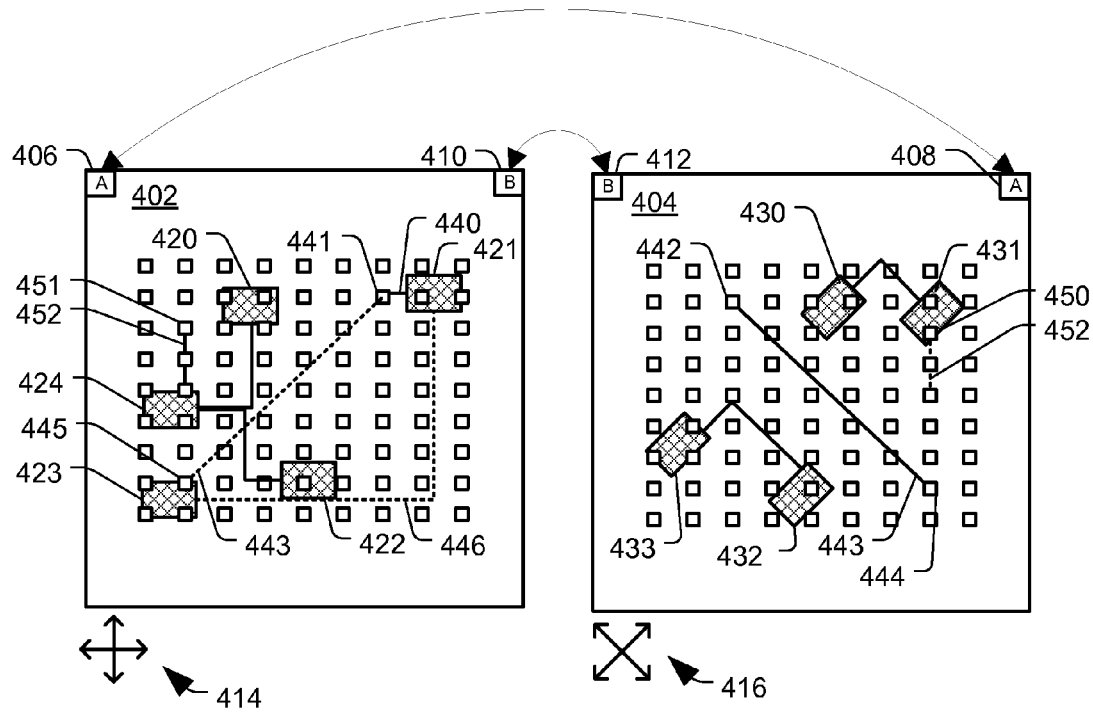
FIG. 4 is a diagram of a particular illustrative embodiment of two die of a three-dimensional integrated circuit stack.

FIG. 4 is a diagram of a particular illustrative embodiment of two dies of a 3D IC stack. For example, the dies 402 and 404 of FIG. 4 may correspond, respectively, to the first die 106 and the second die 108 of FIGS. 1-3.

In FIG. 4, the first die 402 has a first Manhattan wiring scheme (denoted in FIG. 4 by a "plus" shaped symbol 414), and the second die 404 has a second Manhattan wiring scheme (denoted in FIG. 4 by an "X" shaped symbol 416). The first Manhattan wiring scheme 414 is different from the second Manhattan wiring scheme 416. For example, the second Manhattan wiring scheme 416 may be rotated relative to the first Manhattan wiring scheme 414. In a particular embodiment, the second Manhattan wiring scheme 416 has an angular difference of between 40 degrees and 50 degrees (e.g., about 45 degrees) relative to the first Manhattan wiring scheme 414. In other embodiments, the second Manhattan wiring scheme 416 has an angular difference of greater than 5 degrees and less than 85 degrees relative to the first Manhattan wiring scheme 414. Thus, when the first die 402 and the second die 404 are used for form a 3D IC stack, as described further below, the first Manhattan wiring scheme 414 provides diagonal conductive paths relative to the second Manhattan wiring scheme 416, and vice versa.

Each die 402 and 404 include a bonding interface including a set of bonding pads. When stacked to form a 3D IC stack, the bonding interfaces face one another. In FIG. 4, the dies 402, 404 are shown with fiducial marks 406, 408, 410, 412 to indicate how the dies 402, 404 are arranged in the 3D IC stack. To illustrate, when the second die 404 is aligned with and electrically coupled to the first die 402, the first "A" fiducial mark 406 of the first die 402 may be aligned with the second "A" fiducial mark 408 of the second die 404. Likewise, the first "B" fiducial mark 410 of the first die 402 may be aligned with the second "B" fiducial mark 412 of the second die 404.

As illustrated in FIG. 4, each of the dies 402, 404 may include a plurality of electronic devices. For example, the first die 402 includes representative electronic devices 420, 421, 422, 423, and 424. Likewise, the second die 404 includes representative electronic devices 430, 431, 432, and 433. The electronic devices may be interconnected using wiring of the two Manhattan wiring schemes 414, 416 in a manner that reduces overall length of at least some of the interconnects. For example, in FIG. 4, the electronic device 424 is coupled to the electronic device 420 of the first die 402 using wiring of the first die 402. In another example, the electronic device 424 of the first die 402 may be coupled to the electronic device 431 of the second die 404 via wiring 452 of the first die 402, a bonding pad 451 of the first die 402 and a corresponding bonding pad 450 of the second die 404. Thus, in this example, the electronic device 424 is coupled to the electronic device 431 primarily using wiring of the first die 402.

In another example, at least a portion of a conductive path coupling the electronic device 423 of the first die 402 to the electronic device 421 of the first die 402 may include one or more wires of the second die 404. For example, the first electronic device 423 may be coupled to a bonding pad 445 of the first die 402. The bonding pad 445 may be couple to a corresponding bonding pad 444 of the second die 404. The bonding pad 444 of the second die 404 may be coupled to a wire 443 of the second die 404. The wire 443 may be coupled to a bonding pad 442 of the second die 404. The bonding pad 442 of second die 404 may be coupled to a corresponding bonding pad 441 of the first die 402. The bonding pad 441 of the first die 402 may be coupled to a wire 440 of the first die 402. The wire 440 may be coupled to a second electronic device 421. Thus, two electronic devices 423 and 421 of the first die 402 may be coupled together via a conductive path. A first portion of the conductive path may include wiring of the first die 402 (e.g., the wire 440), and a second portion of the conductive path may include wiring of the second die 404 (e.g., the wire 443). The conductive path formed by the wires 443 and 440 may be shorter than a conventional conductive path 446 that could be formed between the electronic devices 423, 421 using the first Manhattan wiring scheme 414 of the first die 402. Thus, a 3D IC stack formed using the first die 402 and the second die 404 can use diagonal routing arrangements that are not available in traditional Manhattan wiring schemes. Additionally, since both of the dies 402 and 404 can be manufactured using Manhattan wiring scheme fabrication processes, difficulty is associated with forming diagonal wires or non-Manhattan wiring schemes can be avoided.

Figure 5:
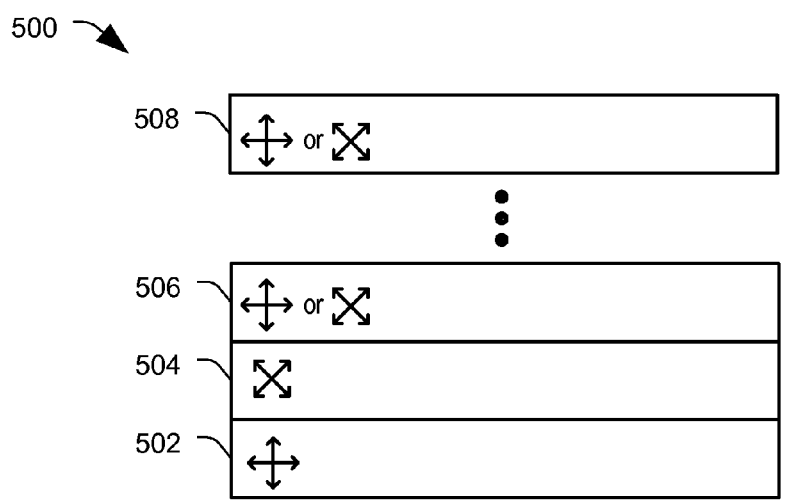
FIG. 5 is a block diagram of a particular illustrative embodiment of a three-dimensional integrated circuit stack.

FIG. 5 is a block diagram of a particular illustrative embodiment of a 3D IC stack 500. In FIG. 5, the first Manhattan wiring scheme 414 and the second Manhattan wiring scheme 416 are represented using the symbols introduced with reference to FIG. 4. In FIG. 5, the 3D IC stack 500 includes a first die 502 including wiring that is arranged according to the first Manhattan wiring scheme. The first die 502 is coupled to a second die 504 that includes wiring that is arranged according to the second Manhattan wiring scheme. In FIG. 5, the 3D IC stack 500 also includes a third die 506. The third die 506 may include wiring arranged according to the first Manhattan wiring scheme, wiring arranged according to the second Manhattan wiring scheme, or wiring arranged according to another (Manhattan or non-Manhattan) wiring scheme. The 3D IC stack 500 may also include one or more additional dies 508. Each of the one or more additional dies 508 may include wiring arranged according to the first Manhattan wiring scheme, wiring arranged according to the second Manhattan wiring scheme, or wiring arranged according to another (Manhattan or non-Manhattan) wiring scheme. Accordingly, the dies 502-508 of the 3D IC stack 500 can use diagonal conductive paths that are not available in traditional Manhattan wiring schemes while avoiding difficulties associated with fabricating devices with non-Manhattan wiring schemes.

One or more of the dies 502-508 of the 3D IC stack 500 may include bonding interfaces on two opposing sides. For example, the second die 504 may include a first bonding interface including a plurality of bonding pads on a side adjacent to the first die 502 and may include a second bonding interface including a plurality of bonding pads on a side adjacent to the third die 506. In a particular embodiment, the second die 504 includes one or more through vias (e.g., through silicon vias (TSVs)) between the first bonding interface and the second bonding interface. In this embodiment, the first die 502 and the third die 506 may be electrically connected without using wiring of the second die 504. Alternately, wiring of the second die 504 may be used to provide at least a portion of a signal path between the first die 502 and the third die 506. Additionally, one or more of the dies 502-508 may include an external interface. For example, the first die 502 may include an external interface on a side opposite the second die 504. In this example, the external interface may be used to electrically the 3D IC stack 500 with devices external to the 3D IC stack. To illustrate, the external interface may be used to provide pin out connections for packaging the 3D IC stack.

Figure 6:
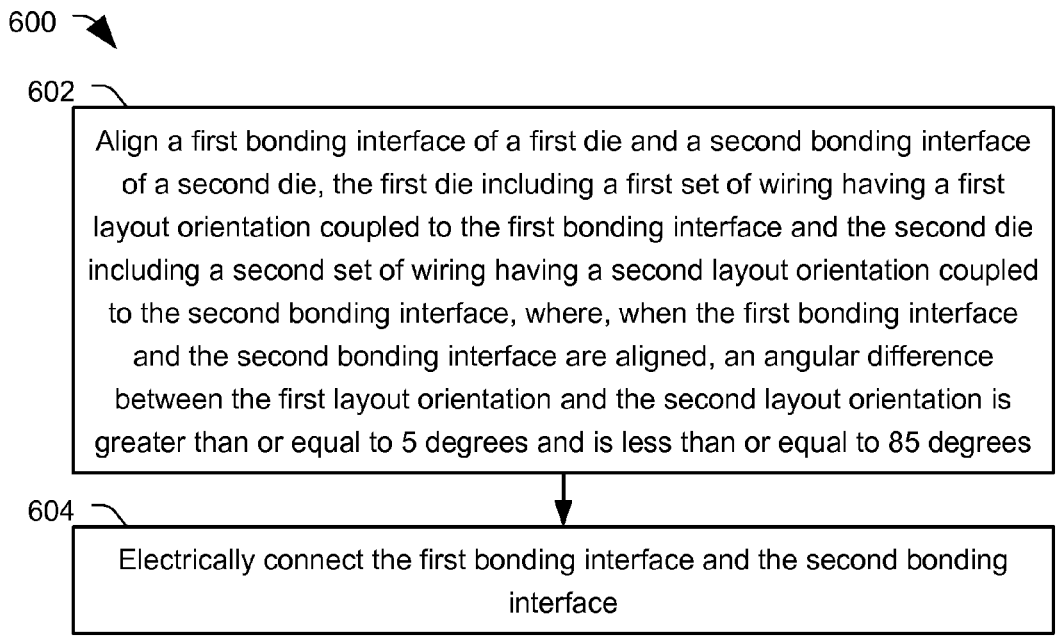
FIG. 6 is a flow chart of a particular illustrative embodiment of a method of forming a three-dimensional integrated circuit stack.

FIG. 6 is a flow chart of a particular illustrative embodiment of a method 600 of forming a three-dimensional integrated circuit stack. For example, the method 600 may be used to form the three-dimensional integrated circuit (IC) stack of FIGS. 1-3, or the three-dimensional IC stack 500 of FIG. 5.

The method 600 includes, at 602, aligning a first bonding interface of a first die and a second bonding interface of a second die. For example, the first bonding interface may include a plurality of bonding pads of the first die, and the second bonding interface may include a plurality of bonding pads of the second die. To illustrate, the first bonding interface may include the bonding pads 116-118 of FIGS. 1-3, and the second bonding interface may include the bonding pads 130-132 of FIGS. 1-3. As another example, the first bonding interface may include the bonding pads of the first die 402 of FIG. 4, and the second bonding interface may include the bonding pads of the second die 404 of FIG. 4.

In the method 600, the first die includes a first set of wiring having a first layout orientation coupled to the first bonding interface, and the second die including a second set of wiring having a second layout orientation coupled to the second bonding interface. For example, the first die 106 may include the first wiring 103 of FIG. 1, and the second die 108 may include the second wiring 105 of FIG. 1. In this example, the first wiring 103 may be arranged according to a layout orientation associated with the first direction 152 and the second direction 153, and the second wiring 105 may be arranged according to a layout orientation associated with a third direction 150 and a fourth direction 151. To illustrate, the first wiring 103 may be arranged according to a first Manhattan routing scheme, and the second wiring 105 may be arranged according to a second Manhattan routing scheme. When the first bonding interface and the second bonding interface are aligned, an angular difference between the first layout orientation and the second layout orientation is greater than or equal to 5 degrees and is less than or equal to 85 degrees. For example, the angular difference may be between 40 degrees and 50 degrees (e.g., about 45 degrees).

The method 600 also includes, at 604, electrically connecting the first bonding interface and the second bonding interface. For example, solder may be applied to one or both of the bonding interfaces. The solder may be heated (e.g., using a reflow process) to electrically (and physically) connect the bonding interfaces. Thus, the method 600 enables formation of a three-dimensional integrated circuit stack such that the three-dimensional integrated circuit stack includes wiring arranged according to two or more different Manhattan wiring schemes. The two or more different Manhattan wiring schemes may enable circuit devices to be coupled to one other via shorter conductive paths than may be achieved using a single Manhattan routing scheme.

The method 600 may be extended to form a 3D IC stack with more than two die. For example, the method 600 may be used to form the 3D IC stack 500 of FIG. 5.

Figure 7:
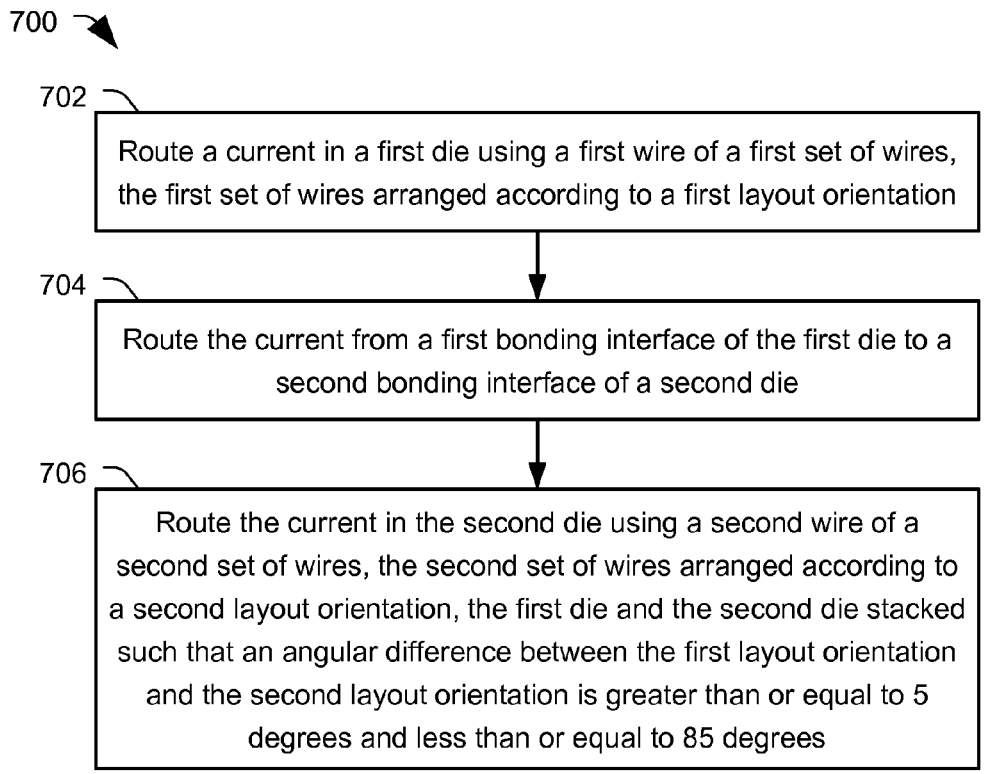
FIG. 7 is a flow chart of a first particular illustrative embodiment of a method of routing a signal using a three-dimensional integrated circuit stack.

FIG. 7 is a flow chart of a first particular illustrative embodiment of a method 700 of routing a signal using a three-dimensional integrated circuit stack. For example, the three-dimensional integrated circuit (IC) stack of FIGS. 1-3, or the three-dimensional IC stack 500 of FIG. 5 may route a signal according to the method 700.

The method 700 includes, at 702, routing a signal in a first die using a first wire of a first set of wires. The first set of wires arranged according to a first layout orientation. For example, the first set of wires may correspond to the first wiring 103 of FIGS. 1-3, which is arranged according to a first Manhattan wiring scheme.

The method 700 also includes, at 704, routing the signal from a first bonding interface of the first die to a second bonding interface of a second die. For example, the signal may be routed from a wire of the first wiring 103 of FIGS. 1-3 to the bonding pad 116 of the first die 106 of FIGS. 1-3. The bonding pad 116 may be electrically coupled to the bonding pad 130 of the second die 108. Accordingly, the signal may be routed to the bonding pad 130 of the second die 108.

The method 700 also includes, at 706, routing the signal in the second die using a second wire of a second set of wires. The second set of wires may be arranged according to a second layout orientation. For example, the signal received at the bonding pad 130 of the second die 108 of FIGS. 1-3, may be routed through one or more wires of the second wiring 105. As explained above, the second wiring 105 may be arranged according to a different layout orientation than the first wiring 103. For example, the first die and the second die may be stacked such that an angular difference between the first layout orientation and the second layout orientation is greater than or equal to 5 degrees and less than or equal to 85 degrees. Thus, the method 700 enables routing a signal within two or more dies of a three-dimensional integrated circuit stack. The two or more dies may have different Manhattan wiring schemes to enable circuit devices to be coupled to one other via shorter conductive paths than may be achieved using a single Manhattan routing scheme.

Although the method 700 illustrates routing a signal in two dies of a 3D IC stack, the method 700 may be extended to route a signal in more than two dies of a 3D IC stack. For example, the method 700 may be extended to route a signal from a first die 502 to a third die 506 of the 3D IC stack 500 of FIG. 5. In this example, one or more of the dies (e.g., the second die 504) may include through silicon vias that are connected to bonding pads of the first die 502 and to bonding pads of the third die 506. Alternately, wiring of the second die 504 may be used to provide at least a portion of a signal path between the first die 502 and the third die 506.

Figure 8:
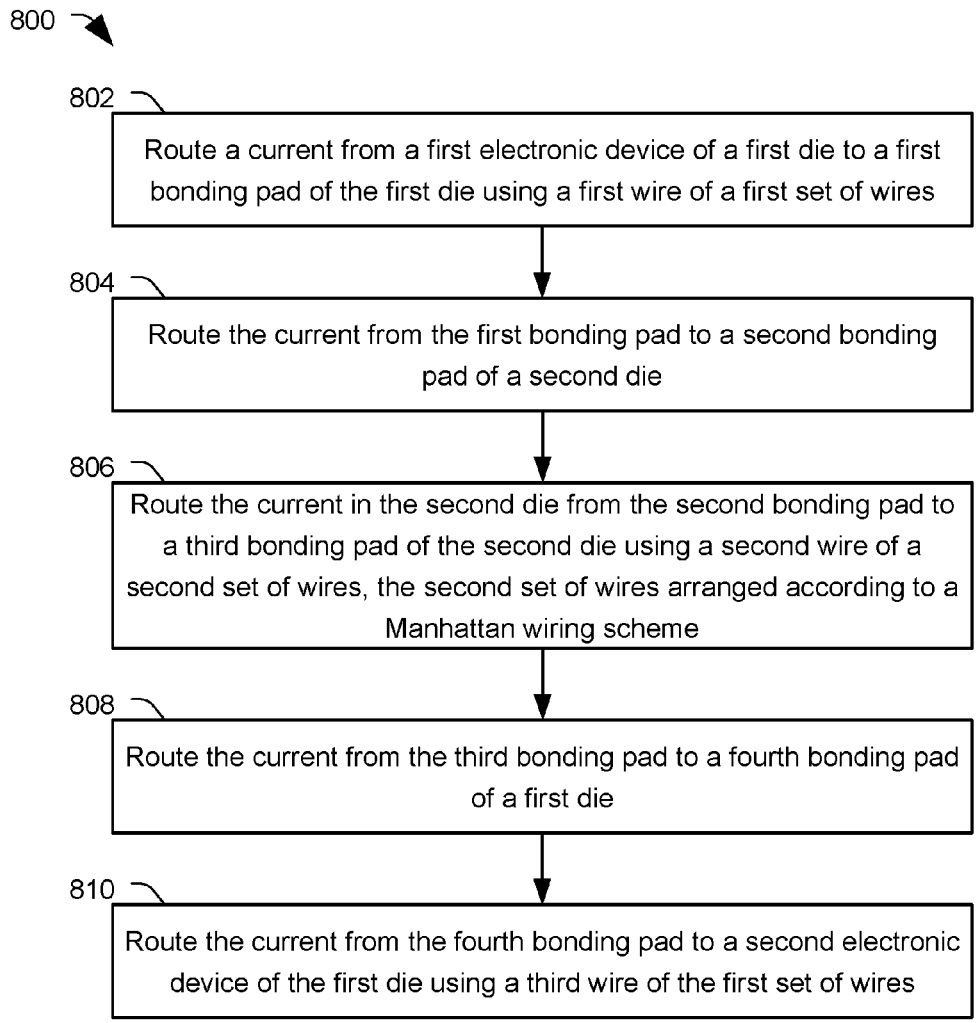
FIG. 8 is a flow chart of a second particular illustrative embodiment of a method of routing a signal using a three-dimensional integrated circuit stack.

FIG. 8 is a flow chart of a second particular illustrative embodiment of a method 800 of routing a signal using a three-dimensional integrated circuit stack. For example, the three-dimensional integrated circuit (IC) stack of FIGS. 1-3, or the three-dimensional IC stack 500 of FIG. 5 may route a signal according to the method 800.

The method 800 includes, at 802, routing a signal from a first electronic device of a first die to a first bonding pad of the first die using a first wire of a first set of wires. For example, the signal may be routed via one or more wires of the first wiring 103 from the third electronic device 160 to the bonding pad 116 of the first die 106 of FIGS. 1-3.

The method 800 includes, at 804, routing the signal from the first bonding pad to a second bonding pad of a second die. For example, the bonding pad 116 of the first die 106 of FIGS. 1-3 may be electrically coupled to the bonding pad 130 of the second die 108. Accordingly, the signal may be routed from the bonding pad 116 to the bonding pad 130.

The method 800 includes, at 806, routing the signal in the second die from the second bonding pad to a third bonding pad of the second die using a second wire of a second set of wires. The second set of wires arranged according to a Manhattan wiring scheme. For example, the signal may be routed via one or more wires of the second wiring 105 from the bonding pad 130 to the bonding pad 132 of the second die 108 of FIGS. 1-3.

The method 800 includes, at 808, routing the signal from the third bonding pad to a fourth bonding pad of the first die. For example, the bonding pad 132 of the second die 108 of FIGS. 1-3 may be electrically coupled to the bonding pad 118 of the first die 106. Accordingly, the signal may be routed from the bonding pad 132 to the bonding pad 118.

The method 800 includes, at 810, routing the signal from the fourth bonding pad to a second electronic device of the first die using a third wire of the first set of wires. For example, the signal may be routed via one or more wires of the first wiring 103 from the bonding pad 132 to the fourth electronic device 162 of the first die 106 of FIGS. 1-3. Thus, the method 800 enables routing a signal between two electronic devices of a single die using wiring of two or more dies of a three-dimensional integrated circuit stack. The two or more dies may have different wiring orientations (e.g., different Manhattan wiring schemes) to enable the electronic devices to be coupled to each other via a shorter conductive path than may be achieved using a single Manhattan routing scheme.

Although the method 800 illustrates routing a signal between two electronic devices of a single die using wiring of a second die of a 3D IC stack, the method 800 may be extended to route a signal using wiring of two or more dies of a 3D IC stack. For example, the method 800 may be extended to route a signal from a first electronic device of the first die 502 to a second electronic device of the first die 502 using wiring of the second die 504 and wiring of the third die 506 of the 3D IC stack 500 of FIG. 5.

Figure 9:
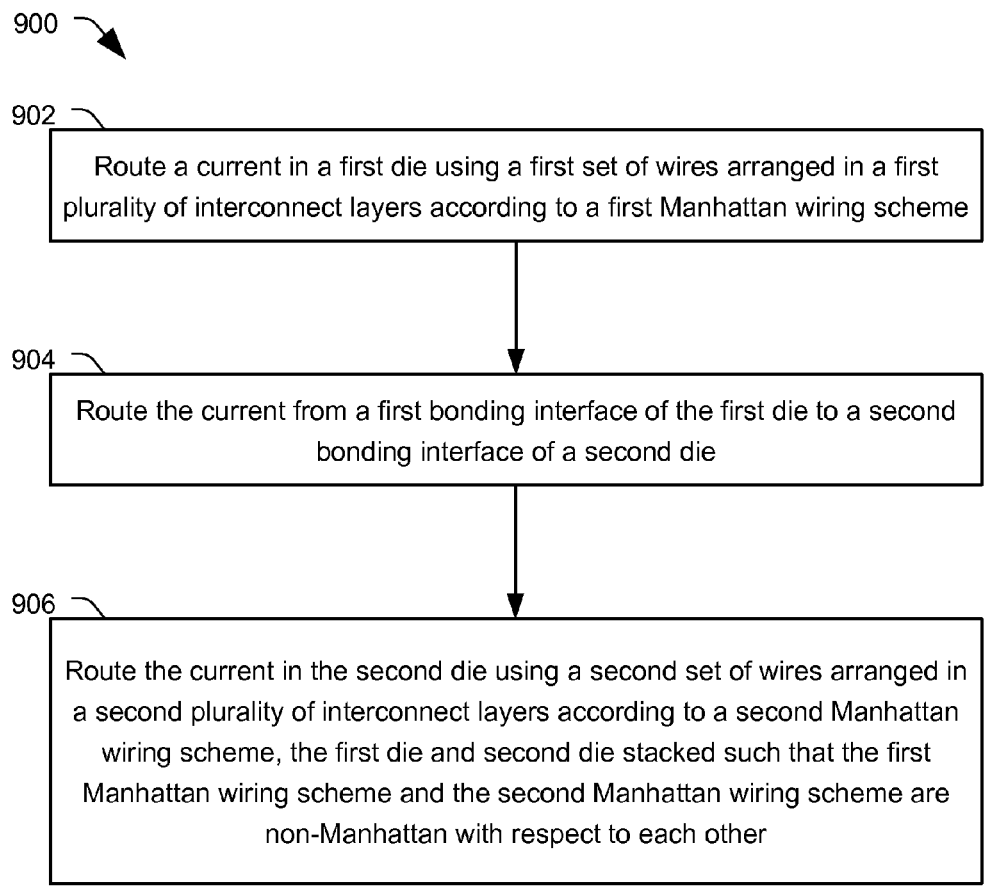
FIG. 9 is a flow chart of a third particular illustrative embodiment of a method of routing a signal using a three-dimensional integrated circuit stack.

FIG. 9 is a flow chart of a third particular illustrative embodiment of a method 900 of routing a signal using a three-dimensional integrated circuit stack. For example, the three-dimensional integrated circuit (IC) stack of FIGS. 1-3, or the three-dimensional IC stack 500 of FIG. 5 may route a signal according to the method 900.

The method 900 includes, at 902, routing a signal in a first die using a first set of wires arranged in a first plurality of interconnect layers according to a first Manhattan wiring scheme. For example, the first set of wires may correspond to the first wiring 103 of FIGS. 1-3, which is arranged in a plurality of interconnect layers according to a first Manhattan wiring scheme.

The method 900 includes, at 904, routing the signal from a first bonding interface of the first die to a second bonding interface of a second die. For example, the signal may be routed from a wire of the first wiring 103 of FIGS. 1-3 to the bonding pad 116 of the first die 106 of FIGS. 1-3. The bonding pad 116 may be electrically coupled to the bonding pad 130 of the second die 108. Accordingly, the signal may be routed to the bonding pad 130 of the second die 108.

The method 900 includes, at 906, routing the signal in the second die using a second set of wires arranged in a second plurality of interconnect layers according to a second Manhattan wiring scheme. The first die and second die stacked are such that the first Manhattan wiring scheme and the second Manhattan wiring scheme are non-Manhattan with respect to each other. For example, the second set of wires may correspond to the second wiring 105 of FIGS. 1-3, which is arranged in a plurality of interconnect layers according to a second Manhattan wiring scheme. The signal received at the bonding pad 130 of the second die 108 of FIGS. 1-3 may be routed through one or more wires of the second wiring 105. As explained above, the first die and the second die may be stacked such that the first Manhattan wiring scheme and the second Manhattan wiring scheme are non-Manhattan with respect to each other. To illustrate, the first die and the second die may be stacked such that there is a non-90 degree angle between the first layout orientation and the second layout orientation. Thus, the method 900 enables routing a signal within two or more dies of a three-dimensional integrated circuit stack. The two or more dies may have different Manhattan wiring schemes to enable circuit devices to be coupled to one other via shorter conductive paths than may be achieved using a single Manhattan routing scheme.

Although the method 900 illustrates routing a signal between electronic devices of two dies using wiring of one or both dies, the method 900 may be extended to route a signal between electronic devices of more than two dies of a 3D IC stack. For example, the method 900 may be extended to route a signal from a first electronic device of the first die 502 to a second electronic device of the third die 506 using wiring of the second die 504, wiring of the first die 502, and/or wiring of the third die 506 of FIG. 5. As another example, the method 900 may be extended to route a signal from a first electronic device of the first die 502 to a second electronic device of the second die 504 and to a third electronic device of the third die 506 using wiring of the second die 504, wiring of the first die 502, and/or wiring of the third die 506 of FIG. 5.

Figure 10:
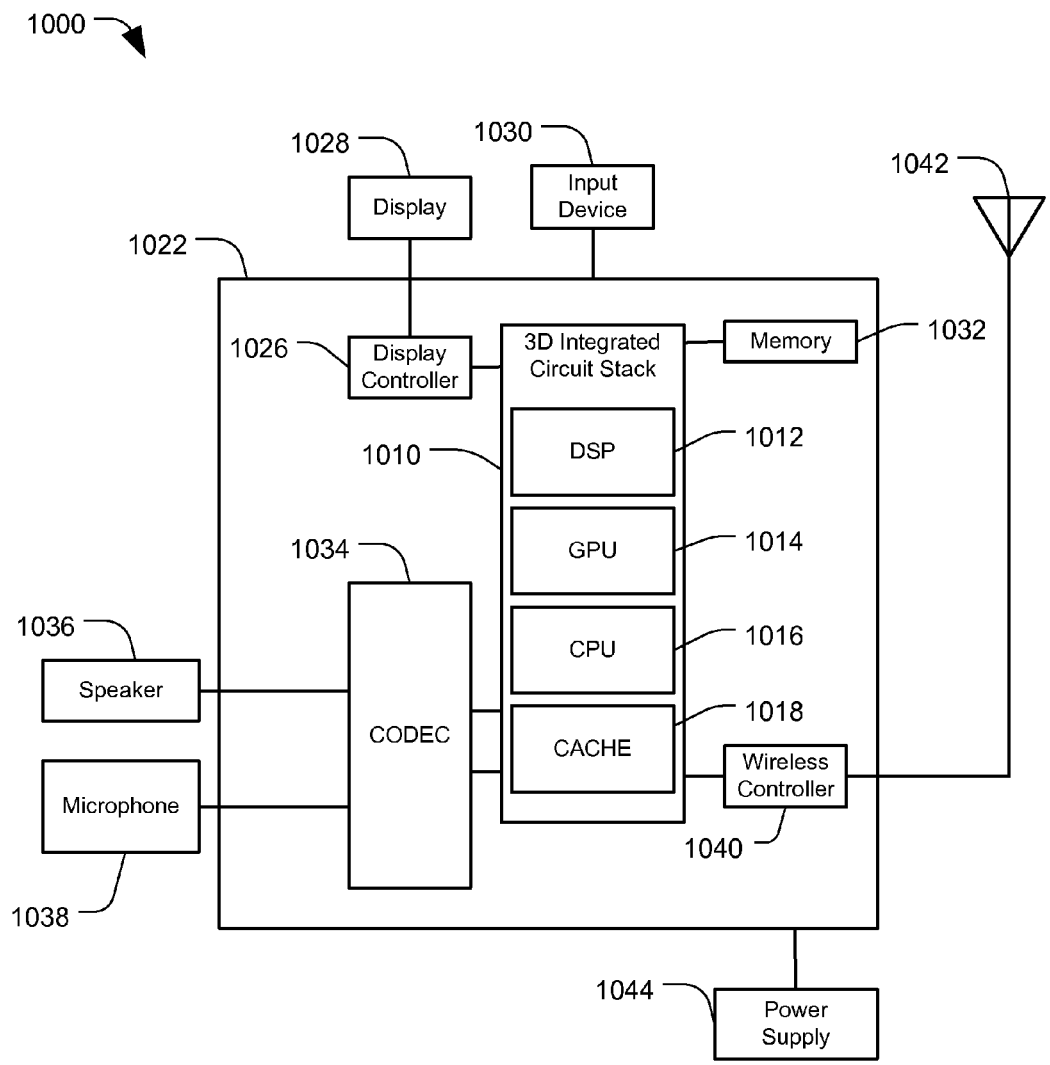
FIG. 10 is a block diagram of a device including a three-dimensional integrated circuit stack.

Referring to FIG. 10, a block diagram of a particular illustrative embodiment of a device is depicted and generally designated 1000. The device 1000 includes a processor, such as a digital signal processor (DSP) 1012, coupled to a memory 1032. In a particular embodiment, the DSP 1012 is part of a 3D IC stack 1010. The 3D IC stack 1010 may include a cache 1018 that is accessible to the DSP 1012. The 3D IC stack may also include other memory or processing components, such as a GPU 1014, a CPU 1016, or both. The 3D IC stack 1010 may be formed of a plurality of dies. Each die of the 3D IC stack 1010 may include wiring arranged according to a Manhattan wiring scheme; however, when stacked, the Manhattan wiring schemes are angularly offset from one another. For example, the 3D IC stack 1010 may include or correspond to the 3D IC stack 100 of FIGS. 1-3, a 3D IC stack formed using the dies 402, 404 of FIG. 4, or the 3D IC stack 500 of FIG. 5.

FIG. 10 also shows a display controller 1026 that is coupled to the DSP 1012, the GPU 1014, the CPU 1016, or a combination thereof, and to a display 1028. A coder/decoder (CODEC) 1034 can also be coupled to the DSP 1012, the GPU 1014, the CPU 1016, or a combination thereof. A speaker 1036 and a microphone 1038 can be coupled to the CODEC 1034.

FIG. 10 also indicates that a wireless controller 1040 can be coupled to the DSP 1012, the GPU 1014, the CPU 1016, or a combination thereof, and to an antenna 1042. In a particular embodiment, the 3D IC stack 1010, the display controller 1026, the memory 1032, the CODEC 1034, and the wireless controller 1040 are included in a system-in-package or system-on-chip device 1022. In a particular embodiment, an input device 1030 and a power supply 1044 are coupled to the system-on-chip device 1022. Moreover, in a particular embodiment, as illustrated in FIG. 10, the display 1028, the input device 1030, the speaker 1036, the microphone 1038, the antenna 1042, and the power supply 1044 are external to the system-on-chip device 1022. However, each of the display 1028, the input device 1030, the speaker 1036, the microphone 1038, the antenna 1042, and the power supply 1044 can be coupled to a component of the system-on-chip device 1022, such as an interface or a controller.

In conjunction with the described embodiments, a device is disclosed that may include a first set of means for routing a signal in a first die, where the first set of means for routing a signal is arranged according to a first layout orientation and is coupled to a first means for interfacing. For example, the first set of means for routing a signal may correspond to or include the first wiring 103 of FIGS. 1-3, wiring arranged according to the first Manhattan wiring scheme 414 of FIGS. 4 and 5, one or more other devices or circuits, or any combination thereof. The first means for interfacing may include or correspond to the bonding pads 116-118 of FIGS. 1-3, the bonding interface of FIG. 4, one or more other devices or circuits, or any combination thereof. The device may also include a second set of means for routing a signal in a second die, where the second set of means for routing a signal is arranged according to a second layout orientation and is coupled to a second means for interfacing. For example, the second set of means for routing a signal may correspond to or include the second wiring 105 of FIGS. 1-3, wiring arranged according to the second Manhattan wiring scheme 416 of FIGS. 4 and 5, one or more other devices or circuits, or any combination thereof. The second means for interfacing may include or correspond to the bonding pads 130-132 of FIGS. 1-3, the bonding interface of FIG. 4, one or more other devices or circuits, or any combination thereof. In the device, the first means for interfacing is coupled to the second means for interfacing such that an angular difference between the first layout orientation and the second layout orientation is greater than or equal to 5 degrees and less than or equal to 85 degrees.

In conjunction with the described embodiments, a device is disclosed that may include a first set of means for routing a signal in a first die, where the first set of means for routing a signal is arranged in a first plurality of interconnect layers according to a first Manhattan wiring scheme. For example, the first set of means for routing a signal may correspond to or include the first wiring 103 of FIGS. 1-3, wiring arranged according to the first Manhattan wiring scheme 414 of FIGS. 4 and 5, one or more other devices or circuits, or any combination thereof. The device may also include a second set of means for routing a signal in a second die, where the second set of means for routing a signal is arranged in a second plurality of interconnect layers according to a second Manhattan wiring scheme. For example, the second set of means for routing a signal may correspond to or include the second wiring 105 of FIGS. 1-3, wiring arranged according to the second Manhattan wiring scheme 416 of FIGS. 4 and 5, one or more other devices or circuits, or any combination thereof. In the device, the first plurality of interconnect layers electrically may be connected to the second plurality of interconnect layers and the first die and second die may be stacked such that the first Manhattan wiring scheme and the second Manhattan wiring scheme are non-Manhattan with respect to each other.

Figure 11:
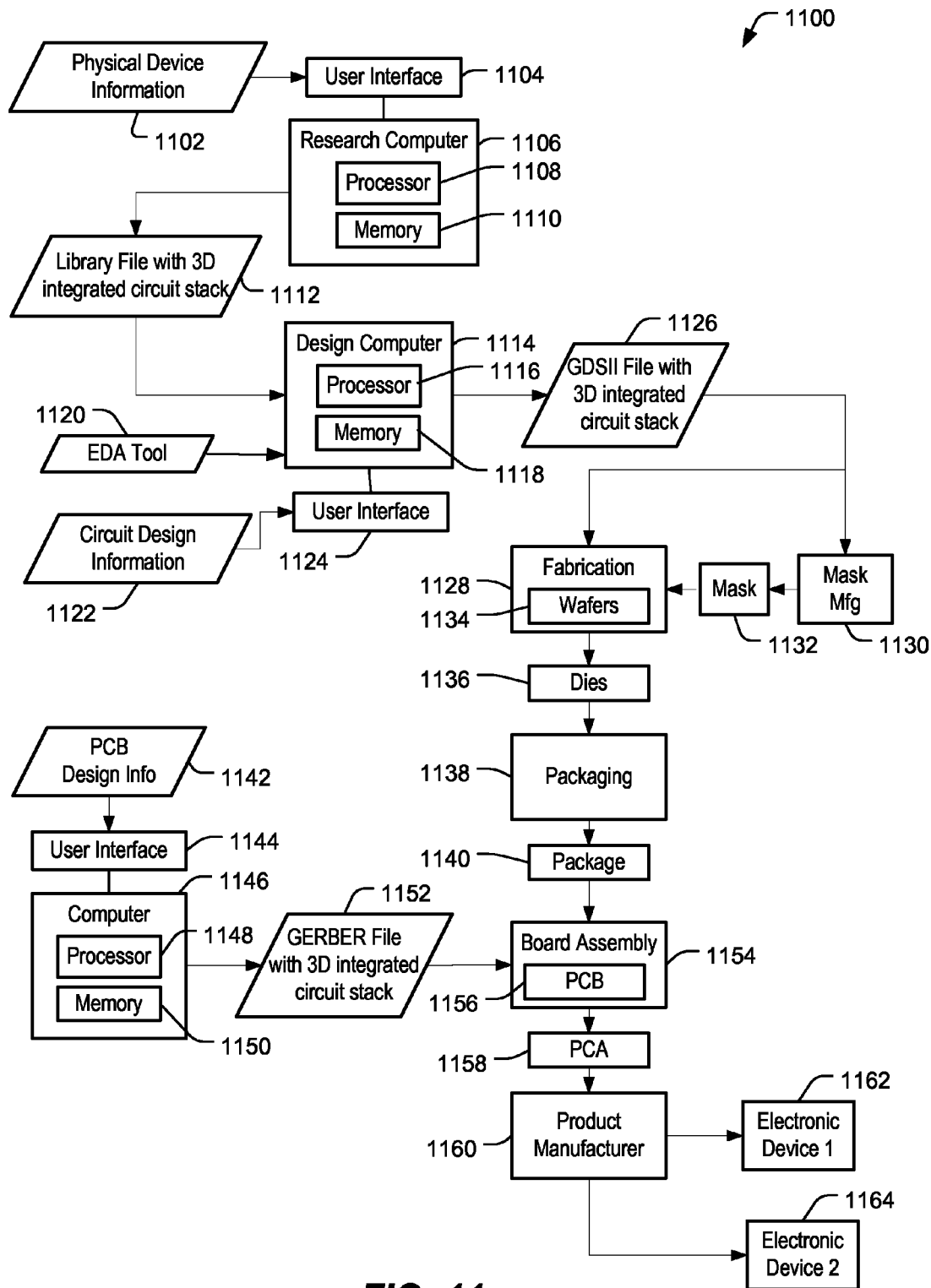
FIG. 11 is a data flow diagram of a particular illustrative embodiment of a manufacturing process to manufacture electronic devices that include a three-dimensional integrated circuit stack.

The foregoing disclosed devices and functionalities may be designed and configured into computer files (e.g. RTL, GDSII, GERBER, etc.) stored on computer readable media. Some or all such files may be provided to fabrication handlers who fabricate devices based on such files. Resulting products include semiconductor wafers that are then cut into semiconductor die and packaged into a semiconductor chip. The chips are then employed in devices described above. FIG. 11 depicts a particular illustrative embodiment of an electronic device manufacturing process 1100.

Physical device information 1102 is received at the manufacturing process 1100, such as at a research computer 1106. The physical device information 1102 may include design information representing at least one physical property of a device, such as a 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof). For example, the physical device information 1102 may include physical parameters, material characteristics, and structure information that is entered via a user interface 1104 coupled to the research computer 1106. The research computer 1106 includes a processor 1108, such as one or more processing cores, coupled to a computer readable medium such as a memory 1110. The memory 1110 may store computer readable instructions that are executable to cause the processor 1108 to transform the physical device information 1102 to comply with a file format and to generate a library file 1112.

In a particular embodiment, the library file 1112 includes at least one data file including the transformed design information. For example, the library file 1112 may include a library of semiconductor devices including a device that includes the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) that is provided for use with an electronic design automation (EDA) tool 1120.

The library file 1112 may be used in conjunction with the EDA tool 1120 at a design computer 1114 including a processor 1116, such as one or more processing cores, coupled to a memory 1118. The EDA tool 1120 may be stored as processor executable instructions at the memory 1118 to enable a user of the design computer 1114 to design a circuit including the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) of the library file 1112. For example, a user of the design computer 1114 may enter circuit design information 1122 via a user interface 1124 coupled to the design computer 1114. The circuit design information 1122 may include design information representing at least one physical property of a semiconductor device, such as one or more dies of the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof). To illustrate, the circuit design property may include identification of particular circuits and relationships to other elements in a circuit design, positioning information, feature size information, interconnection information, or other information representing a physical property of a semiconductor device.

The design computer 1114 may be configured to transform the design information, including the circuit design information 1122, to comply with a file format. To illustrate, the file formation may include a database binary file format representing planar geometric shapes, text labels, and other information about a circuit layout in a hierarchical format, such as a Graphic Data System (GDSII) file format. The design computer 1114 may be configured to generate a data file including the transformed design information, such as a GDSII file 1126 that includes information describing the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) in addition to other circuits or information. To illustrate, the data file may include information corresponding to a system-on-chip (SOC) that includes the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) and that also includes additional electronic circuits and components within the SOC.

The GDSII file 1126 may be received at a fabrication process 1128 to manufacture the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) according to transformed information in the GDSII file 1126. For example, a device manufacture process may include providing the GDSII file 1126 to a mask manufacturer 1130 to create one or more masks, such as masks to be used with photolithography processing, illustrated as a representative mask 1132. The mask 1132 may be used during the fabrication process to generate one or more wafers 1134, which may be tested and separated into dies, such as a representative die 1136. The two or more of the dies 1136 may be stacked to form the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof).

The 3D IC stack may be provided to a packaging process 1138 where the 3D IC stack is incorporated into a representative package 1140. For example, the package 1140 may include the multiple dies in a system-in-package (SiP) arrangement. The package 1140 may be configured to conform to one or more standards or specifications, such as Joint Electron Device Engineering Council (JEDEC) standards.

Information regarding the package 1140 may be distributed to various product designers, such as via a component library stored at a computer 1146. The computer 1146 may include a processor 1148, such as one or more processing cores, coupled to a memory 1150. A printed circuit board (PCB) tool may be stored as processor executable instructions at the memory 1150 to process PCB design information 1142 received from a user of the computer 1146 via a user interface 1144. The PCB design information 1142 may include physical positioning information of a packaged semiconductor device on a circuit board, the packaged semiconductor device corresponding to the package 1140 including the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof).

The computer 1146 may be configured to transform the PCB design information 1142 to generate a data file, such as a GERBER file 1152 with data that includes physical positioning information of a packaged semiconductor device on a circuit board, as well as layout of electrical connections such as traces and vias, where the packaged semiconductor device corresponds to the package 1140 including the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof). In other embodiments, the data file generated by the transformed PCB design information may have a format other than a GERBER format.

The GERBER file 1152 may be received at a board assembly process 1154 and used to create PCBs, such as a representative PCB 1156, manufactured in accordance with the design information stored within the GERBER file 1152. For example, the GERBER file 1152 may be uploaded to one or more machines to perform various steps of a PCB production process. The PCB 1156 may be populated with electronic components including the package 1140 to form a representative printed circuit assembly (PCA) 1158.

The PCA 1158 may be received at a product manufacture process 1160 and integrated into one or more electronic devices, such as a first representative electronic device 1162 and a second representative electronic device 1164. As an illustrative, non-limiting example, the first representative electronic device 1162, the second representative electronic device 1164, or both, may be selected from the group of a set top box, a music player, a video player, an entertainment unit, a navigation device, a communications device, a personal digital assistant (PDA), a fixed location data unit, and a computer, into which the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) is integrated. As another illustrative, non-limiting example, one or more of the electronic devices 1162 and 1164 may be remote units such as mobile phones, hand-held personal communication systems (PCS) units, portable data units such as personal data assistants, global positioning system (GPS) enabled devices, navigation devices, fixed location data units such as meter reading equipment, or any other device that stores or retrieves data or computer instructions, or any combination thereof. Although FIG. 11 illustrates remote units according to teachings of the disclosure, the disclosure is not limited to these illustrated units. Embodiments of the disclosure may be suitably employed in any device which includes active integrated circuitry including memory and on-chip circuitry.

A device that includes the 3D IC stack including a plurality of dies with different wiring schemes (e.g., the 3D IC stack 100 of FIG. 1, a 3D IC stack formed using the dies 402, 404 of FIG. 4, the 3D IC stack 500 of FIG. 5, or any combination thereof) may be fabricated, processed, and incorporated into an electronic device, as described in the illustrative process 1100. One or more aspects of the embodiments disclosed with respect to FIGS. 1-10 may be included at various processing stages, such as within the library file 1112, the GDSII file 1126, and the GERBER file 1152, as well as stored at the memory 1110 of the research computer 1106, the memory 1118 of the design computer 1114, the memory 1150 of the computer 1146, the memory of one or more other computers or processors (not shown) used at the various stages, such as at the board assembly process 1154, and also incorporated into one or more other physical embodiments, such as the mask 1132, the dies 1136, the package 1140, the PCA 1158, other products such as prototype circuits or devices (not shown), or any combination thereof. Although various representative stages of production from a physical device design to a final product are depicted, in other embodiments fewer stages may be used or additional stages may be included. Similarly, the process 1100 may be performed by a single entity or by one or more entities performing various stages of the process 1100.

Those of skill would further appreciate that the various illustrative logical blocks, configurations, modules, circuits, and algorithm steps described in connection with the embodiments disclosed herein may be implemented as electronic hardware, computer software executed by a processor, or combinations of both. Various illustrative components, blocks, configurations, modules, circuits, and steps have been described above generally in terms of their functionality. Whether such functionality is implemented as hardware or processor executable instructions depends upon the particular application and design constraints imposed on the overall system. Skilled artisans may implement the described functionality in varying ways for each particular application, but such implementation decisions should not be interpreted as causing a departure from the scope of the present disclosure.

The steps of a method or algorithm described in connection with the embodiments disclosed herein may be embodied directly in hardware, in a software module executed by a processor, or in a combination of the two. A software module may reside in random access memory (RAM), flash memory, read-only memory (ROM), programmable read-only memory (PROM), erasable programmable read-only memory (EPROM), electrically erasable programmable read-only memory (EEPROM), registers, hard disk, a removable disk, a compact disc read-only memory (CD-ROM), or any other form of non-transient storage medium known in the art. An exemplary storage medium is coupled to the processor such that the processor can read information from, and write information to, the storage medium. In the alternative, the storage medium may be integral to the processor. The processor and the storage medium may reside in an application-specific integrated circuit (ASIC). The ASIC may reside in a computing device or a user terminal. In the alternative, the processor and the storage medium may reside as discrete components in a computing device or user terminal.

The previous description of the disclosed embodiments is provided to enable a person skilled in the art to make or use the disclosed embodiments. Various modifications to these embodiments will be readily apparent to those skilled in the art, and the principles defined herein may be applied to other embodiments without departing from the scope of the disclosure. Thus, the present disclosure is not intended to be limited to the embodiments shown herein but is to be accorded the widest scope possible consistent with the principles and novel features as defined by the following claims.

What is claimed is:

1. A three-dimensional integrated circuit (IC) stack comprising:
   a first die including a first set of wiring having a first layout orientation and a first bonding interface coupled to the first set of wiring; and
   a second die including a second set of wiring having a second layout orientation and a second bonding interface coupled to the second set of wiring, the first die and the second die stacked with the first bonding interface coupled to the second bonding interface, wherein an angular difference between the first layout orientation and the second layout orientation is greater than or equal to 5 degrees and less than or equal to 85 degrees.

2. The three-dimensional IC stack of claim 1, wherein the first layout orientation corresponds to a Manhattan routing of the first set of wiring within the first die, wherein the second layout orientation corresponds to a Manhattan routing of the second set of wiring within the second die, and wherein the first layout orientation and the second layout orientation are non-Manhattan with respect to each other.

3. The three-dimensional IC stack of claim 1, wherein the angular difference is between 40 degrees and 50 degrees.

4. The three-dimensional IC stack of claim 1, wherein the first die includes an external interface on a surface opposite the first bonding interface and a through silicon via (TSV) coupling the first set of wiring to the external interface.

5. The three-dimensional IC stack of claim 1, wherein the first die comprises a memory die including a plurality of memory elements coupled to the first set of wiring and the second die comprises a processing die including a plurality of processing elements coupled to the second set of wiring.

6. The three-dimensional IC stack of claim 1, wherein the first die includes a first electronic component and the second die includes a second electronic component, wherein a conductive path between the first electronic component and the second electronic component includes a first portion of the conductive path corresponding to wiring of the first set of wiring and includes a second portion of the conductive path corresponding to wiring of the second set of wiring.

7. The three-dimensional IC stack of claim 1, wherein the first die includes a first electronic component and includes a third electronic component, wherein a conductive path between the first electronic component and the third electronic component includes a first portion of the conductive path corresponding to wiring of the first set of wiring and includes a second portion of the conductive path corresponding to wiring of the second set of wiring.

8. The three-dimensional IC stack of claim 1,
wherein the first bonding interface includes a plurality of first bonding pads arranged in first rows, the first rows oriented substantially parallel to particular wires of the first set of wiring and oriented substantially perpendicular to other wires of the first set of wiring; and
wherein the second bonding interface includes a plurality of second bonding pads arranged in second rows, the second rows oriented neither parallel to nor perpendicular to wires of the second set of wiring.

9. The three-dimensional IC stack of claim 1,
wherein the first set of wiring is arranged in multiple interconnect layers including a first interconnect layer having wires oriented in a first direction and a second interconnect layer including wires oriented in a second direction that is perpendicular to the first direction; and
wherein the second set of wiring is arranged in multiple interconnect layers including a third interconnect layer having wires oriented in a third direction and a fourth interconnect layer including wires oriented in a fourth direction that is perpendicular to the third direction, and wherein the third direction is at an acute angle relative to the first direction.

10. A device comprising:
a first set of means for routing a signal in a first die, the first set of means for routing a signal arranged according to a first layout orientation and coupled to a first means for interfacing; and
a second set of means for routing a signal in a second die, the second set of means for routing a signal arranged according to a second layout orientation and coupled to a second means for interfacing, the first means for interfacing coupled to the second means for interfacing such that an angular difference between the first layout orientation and the second layout orientation is greater than or equal to 5 degrees and less than or equal to 85 degrees.

11. The device of claim 10, further comprising a third set of means for routing a signal in a third die, the third die coupled to the first die such that the third set of means for routing is connected to the first set of means for routing.

12. The device of claim 11, wherein the third die is coupled to the first die such that an angular difference between the first layout orientation and a third layout orientation of the third set of means for routing is greater than or equal to 5 degrees and less than or equal to 85 degrees.

13. A method comprising:
aligning a first bonding interface of a first die and a second bonding interface of a second die, the first die including a first set of wiring having a first layout orientation coupled to the first bonding interface and the second die including a second set of wiring having a second layout orientation coupled to the second bonding interface, wherein, when the first bonding interface and the second bonding interface are aligned, an angular difference between the first layout orientation and the second layout orientation is greater than or equal to 5 degrees and is less than or equal to 85 degrees; and
electrically connecting the first bonding interface and the second bonding interface.

14. The method of claim 13, wherein aligning the first bonding interface and the second bonding interface includes rotating the first die relative to the second die such that bonding pads of the first bonding interface and the second bonding interface are substantially aligned and sides of the first die and the second die are substantially aligned.

15. A method comprising:
routing a signal to a first bonding interface of a first die using a first wire of a first set of wires, the first set of wires arranged according to a first layout orientation;
routing the signal from the first bonding interface of the first die to a second bonding interface coupled to a second wire of a second die; and
routing the signal in the second die using the second wire of a second set of wires, the second set of wires arranged according to a second layout orientation, the first die and the second die stacked such that an angular difference between the first layout orientation and the second layout orientation is greater than or equal to 5 degrees and less than or equal to 85 degrees.

16. The method of claim 15, further composing, prior to routing the signal in the first die using the first wire, routing the signal from the second bonding interface to the first bonding interface based on an output of a circuit element of the second die.

17. A three-dimensional integrated circuit (IC) stack comprising:
a first die including a first bonding interface and a first plurality of interconnect layers arranged according to a first Manhattan wiring scheme; and
a second die including a second bonding interface and a second plurality of interconnect layers arranged according to a second Manhattan wiring scheme, the first die and the second die stacked with the first bonding interface coupled to the second bonding interface such that the first Manhattan wiring scheme and the second Manhattan wiring scheme are non-Manhattan with respect to each other.

18. The three-dimensional IC stack of claim 17, wherein:
the first plurality of interconnect layers includes a first interconnect layer having a first wire routing direction and a second interconnect layer having a second wire routing direction, the first wire routing direction perpendicular to the second wire routing direction; and
the second plurality of interconnect layers includes a third interconnect layer having a third wire routing direction and a fourth interconnect layer having a fourth wire routing direction, the third wire routing direction perpendicular to the fourth wire routing direction and the first wire routing direction neither parallel to nor perpendicular to the third wire routing direction.

19. The three-dimensional IC stack of claim 17, wherein the first Manhattan wiring scheme has between 40 degrees and 50 degrees angular offset from the second Manhattan wiring scheme.

20. The three-dimensional IC stack of claim 17,
wherein the first bonding interface includes a plurality of first bonding pads arranged in first rows, the first rows oriented according to the first Manhattan wiring scheme; and
wherein the second bonding interface includes a plurality of second bonding pads arranged in second rows, the second rows oriented according to the first Manhattan wiring scheme.

21. A device comprising:
a first set of means for routing a signal in a first die, the first set of means for routing a signal arranged in a first plurality of interconnect layers according to a first Manhattan wiring scheme; and
a second set of means for routing a signal in a second die, the second set of means for routing a signal arranged in a second plurality of interconnect layers according to a second Manhattan wiring scheme, the first plurality of interconnect layers electrically connected to the second plurality of interconnect layers and the first die and the second die stacked such that the first Manhattan wiring scheme and the second Manhattan wiring scheme are non-Manhattan with respect to each other.

22. The device of claim 21, further comprising a third set of means for routing a signal in a third die, the third die coupled to the first die such that the third set of means for routing is connected to the first set of means for routing.

23. A method comprising:
routing a signal in a first die using a first set of wires arranged in a first plurality of interconnect layers according to a first Manhattan wiring scheme;
routing the signal from a first bonding interface of the first die to a second bonding interface of a second die; and
routing the signal in the second die using a second set of wires arranged in a second plurality of interconnect layers according to a second Manhattan wiring scheme, the first die and second die stacked such that the first Manhattan wiring scheme and the second Manhattan wiring scheme are non-Manhattan with respect to each other.

24. The method of claim 23, further composing, prior to routing the signal in the first die using the first set of wires, routing the signal from the second bonding interface to the first bonding interface based on an output of a circuit element of the second die.

25. A three-dimensional integrated circuit (IC) stack comprising:
a first die including a first electronic device, a second electronic device, and a first set of wires that are arranged according to a first Manhattan wiring scheme and are coupled to a first bonding interface; and
a second die including a second set of wires coupled to a second bonding interface, the first die and the second die stacked such that the first bonding interface is coupled to the second bonding interface to form a conductive path between the first electronic device and the second electronic device using a wire of the second set of wires, wherein the conductive path is shorter than a conventional path between the first electronic device and the second electronic device based on the first Manhattan wiring scheme.

26. The three-dimensional IC stack of claim 25, wherein the second set of wires is arranged according to a second Manhattan wiring scheme, and wherein the first Manhattan wiring scheme and the second Manhattan wiring scheme are non-Manhattan with respect to each other.

27. The three-dimensional IC stack of claim 25, wherein the conductive path includes a wire of the first set of wires that is oriented in a direction that is angularly offset between 40 degrees and 50 degrees relative to the wire of the second set of wires.

28. The three-dimensional IC stack of claim 25,
wherein the first bonding interface includes a plurality of first bonding pads arranged in first rows, the first rows oriented according to the first Manhattan wiring scheme; and
wherein the second bonding interface includes a plurality of second bonding pads arranged in second rows, the second rows oriented according to the first Manhattan wiring scheme.

29. The three-dimensional IC stack of claim 25, wherein the conductive path is configured to route a signal from the first electronic device of the first die to a first bonding pad of the first die using a first wire of the first set of wires, to route the signal from the first bonding pad to a second bonding pad of the second die, to route the signal in the second die from the second bonding pad to a third bonding pad of the second die using a second wire of the second set of wires, the second set of wires arranged according to a second Manhattan wiring scheme, to route the signal from the third bonding pad to a fourth bonding pad of the first die, and to route the signal from the fourth bonding pad to the second electronic device of the first die using a third wire of the first set of wires.

* * * * *